United States Patent
Chih et al.

(10) Patent No.: US 11,915,752 B2
(45) Date of Patent: Feb. 27, 2024

(54) RESISTIVE MEMORY WITH ENHANCED REDUNDANCY WRITING

(71) Applicant: Taiwan Semiconductor Manufacturing Company, Ltd., Hsinchu (TW)

(72) Inventors: Yu-Der Chih, Hsin-Chu (TW); Chung-Cheng Chou, Hsin-Chu (TW); Chun-Yun Wu, Fuxing Township, Changhua County (TW); Chen-Ming Hung, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 42 days.

(21) Appl. No.: 17/709,662

(22) Filed: Mar. 31, 2022

(65) Prior Publication Data
US 2023/0317159 A1    Oct. 5, 2023

(51) Int. Cl.
G11C 13/00 (2006.01)
(52) U.S. Cl.
CPC ...... G11C 13/0069 (2013.01); G11C 13/0026 (2013.01); G11C 13/0028 (2013.01); G11C 13/0038 (2013.01); G11C 13/004 (2013.01); G11C 13/0064 (2013.01)
(58) Field of Classification Search
CPC ............ G11C 13/0069; G11C 13/0026; G11C 13/0028; G11C 13/0038; G11C 13/004; G11C 13/0064
See application file for complete search history.

(56) References Cited

U.S. PATENT DOCUMENTS

| | | | |
|---|---|---|---|
| 8,934,292 B2 * | 1/2015 | Costa | G11C 13/0007 365/163 |
| 9,251,893 B2 * | 2/2016 | Chung | G11C 11/5678 |
| 2004/0088612 A1 | 5/2004 | Seong | |
| 2006/0227592 A1 * | 10/2006 | Parkinson | G11C 11/5678 365/148 |
| 2009/0040812 A1 * | 2/2009 | Kang | G11C 13/0069 365/163 |
| 2009/0040816 A1 * | 2/2009 | Kang | G11C 13/0004 365/163 |
| 2011/0141832 A1 * | 6/2011 | Balakrishnan | G11C 17/18 365/189.16 |
| 2012/0033491 A1 * | 2/2012 | Shelton | G11C 16/10 365/185.23 |

(Continued)

OTHER PUBLICATIONS

Taiwan Office Action for Application No. 112104071 dated Jan. 3, 2024.

*Primary Examiner* — Khamdan N. Alrobaie
(74) *Attorney, Agent, or Firm* — MERCHANT & GOULD P.C.

(57) ABSTRACT

A memory device includes a main array comprising main memory cells; a redundancy array comprising redundancy memory cells; and write circuitry configured to perform a first programming operation on a main memory cell, to detect whether a current of the main memory cell exceeds a predefined current threshold during the first programming operation, and to disable a second programming operation for a redundancy memory cell if the current of the main memory cell exceeds the predefined current threshold during the first programming operation.

20 Claims, 10 Drawing Sheets

(56) References Cited

U.S. PATENT DOCUMENTS

| | | | |
|---|---|---|---|
| 2013/0088911 A1* | 4/2013 | Nakura | G11C 13/004 365/148 |
| 2013/0163348 A1* | 6/2013 | Yoon | G11C 29/026 365/189.05 |
| 2019/0325977 A1* | 10/2019 | Hoang | G11C 7/08 |

* cited by examiner

| Det_A | Det_B | EN_A | EN_B |
|---|---|---|---|
| 1 | 1 | 1 | 0 |
| 1 | 0 | 1 | 0 |
| 0 | 1 | 0 | 1 |
| 0 | 0 | 1 | 0 |

RESISTIVE MEMORY WITH ENHANCED REDUNDANCY WRITING

BACKGROUND

Resistive Random Access Memory (RRAM) is a memory technology that uses a change in resistance rather than charge to store bits of information. RRAM-based devices show many encouraging properties compared to existing traditional memory architectures. However, since fabrication processes are relatively new, RRAM devices can be subject to reliability issues. Some RRAM devices therefore implement a redundancy array, sometimes referred to as a "two-cells per one-bit" scheme, to improve reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
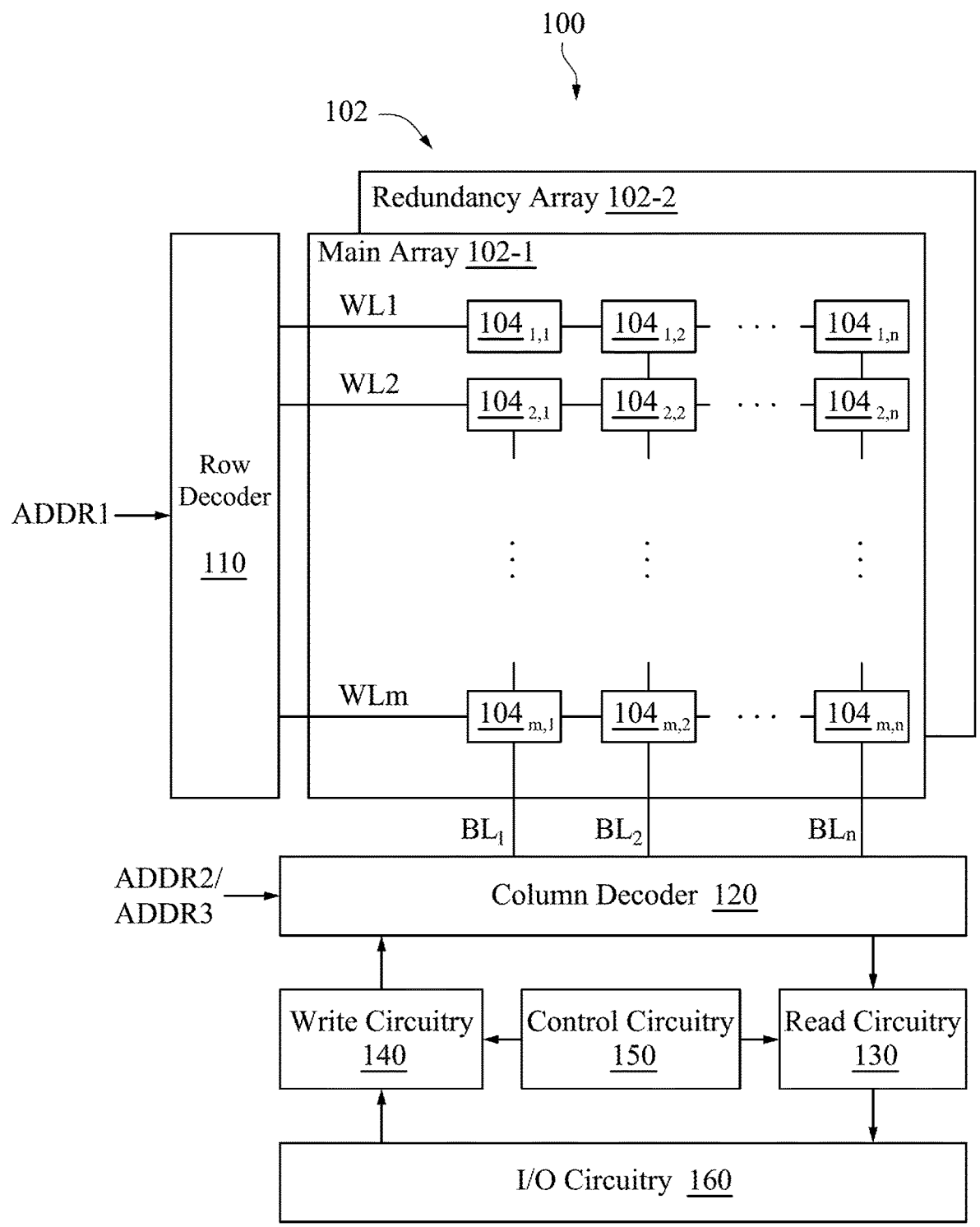
FIG. 1 is a block diagram of a memory device configured to perform write operations with reduced current and programming time in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some disclosed embodiments herein relate to systems and/or methods for performing write operations with reduced current and programming time for a memory device implementing a "two-cells per one-bit" (2CPB) scheme. The memory device may comprise a Resistive Random Access Memory (RRAM) device. In a two-cells per one-bit process, a bit of data is written to two RRAM cells for redundancy. However, for current RRAM devices, this means performing two programming cycles which may constrain power and time resources so that this redundancy can be achieved. Implementing redundancy with two cells for each bit results in each write operation using two programming cycles and twice the current as compared to one cell applications.

FIG. 1 is a block diagram of a memory device 100 configured to perform write operations with reduced current and programming time in accordance with some embodiments. The memory device 100 includes one or more memory arrays 102 made up of memory cells 104. In particular, in one embodiment, the memory device 100 implements a two-cells per one-bit scheme comprising a main array 102-1 and a redundancy array 102-2. Accordingly, one bit may be composed using two memory cells— one memory cell 104 in the main array 102-1 and a corresponding memory cell 104 cell in the redundancy array 102-2.

Each memory array 102 may comprise a grid of memory cells $104_{1,1}$-$104_{m,n}$ arranged in rows and columns. Memory cells 104 within a row (e.g., $104_{1,1}$-$104_{1,n}$) are operably coupled to a word line $WL_1$-$WL_m$, and memory cells 104 within a column (e.g., $104_{1,1}$-$104_{m,i}$) are operably coupled to a bit line $BL_1$-$BL_n$. Thus, each memory cell 104 is accessible via an address defined by an intersection of a word line and bit line. For simplicity, memory cells 104 are shown and described with respect to the main array 102-1 although it will be appreciated that the redundancy array 102-2 may be similarly configured.

Read and write operations are performed on selected memory cells 104 by selectively applying signals to the word lines and bit lines. For example, a row decoder 110 is configured to selectively apply a signal (e.g., voltage and/or current) to one or more of the plurality of word lines $WL_1$-$WL_m$ based on a first address ADDR1, and a column decoder 120 is configured to selectively apply a signal (e.g., voltage and/or current) to one or more of the plurality of bit lines $BL_1$-$BL_n$ based on second and/or third addresses ADDR2/ADDR3. For a read operation, the applied signals cause read circuitry 130 to receive a signal (e.g., voltage and/or current) having a value that is dependent on the state of the selected memory cell 104. For a write operation, the applied signals cause write circuitry 140 to provide a signal (e.g., voltage and/or current) that programs a value to the selected memory cell 104.

Control circuitry 150 outputs control signals to the read circuitry 130 and write circuitry 140 for performing read and write operations in accordance with externally provided command signals. Input/Output (I/O) circuitry 160 outputs data read from the read circuitry 130 and provides externally input data to the write circuitry 140. The main array 102-1 and redundancy array 102-2 may share the support circuitry of the memory device 100 including all or portions of the row decoder 110, column decoder 120, read circuitry 130, write circuitry 140, control circuitry 150, and/or I/O circuitry 160. In the illustrated example, the memory arrays 110 102 are arranged one over the other, though other implementations may have other arrangements such as a side-by-side, symmetric, and/or non-symmetric arrangements.

The memory cells 104 may comprise Resistive Random Access Memory (RRAM) cells having variable resistive elements to store bits of data, though the disclosure is not limited to RRAM. Accordingly, during a write operation to a RRAM cell, a "set" voltage is applied across the upper and lower electrodes to change the variable resistance dielectric layer from a first resistivity (e.g., a high resistance state (HRS) corresponding with logic "0") to a second resistivity (e.g., a low resistance state (LRS) corresponding with logic "1"). Similarly, a "reset" voltage is applied across the upper and lower electrodes to change the variable resistance dielectric layer from the second resistivity back to the first resistivity, for example, from LRS to HRS.

Unfortunately, RRAM cells may have variations in the resistance levels of their LRS and HRS, which can cause reliability issues. Thus, as previously mentioned, the memory device 100 may use a two-cells per one-bit configuration to improve reliability. For example, to perform a set programming operation, a first set operation is performed on a memory cell 104 of the main array 102-1 and a second set operation is performed on a memory cell 104 of the redundancy array 102-2 to provide a copy. In current RRAM devices, this means that each write operation involves two programming cycles and twice the current as compared to one cell applications.

The memory device 100 is enhanced to reduce current and programming time for a two-cells per one-bit configuration. In particular, write circuitry 140 is configured to determine whether a first write operation performed on the main array 102-1 has been reliably performed based on a detected write current of the memory cell 104. If the detected write current is sufficient such that data retention of the memory cell 104 is not a concern, the write circuitry 140 is configured to disable the corresponding second write operation that would have been performed on the redundancy array 102-2 for backup. Advantageously, the memory device 100 saves power and improves programming time by disabling the second write operation if the first write operation is stable such that there is no retention concern.

Figure 2:
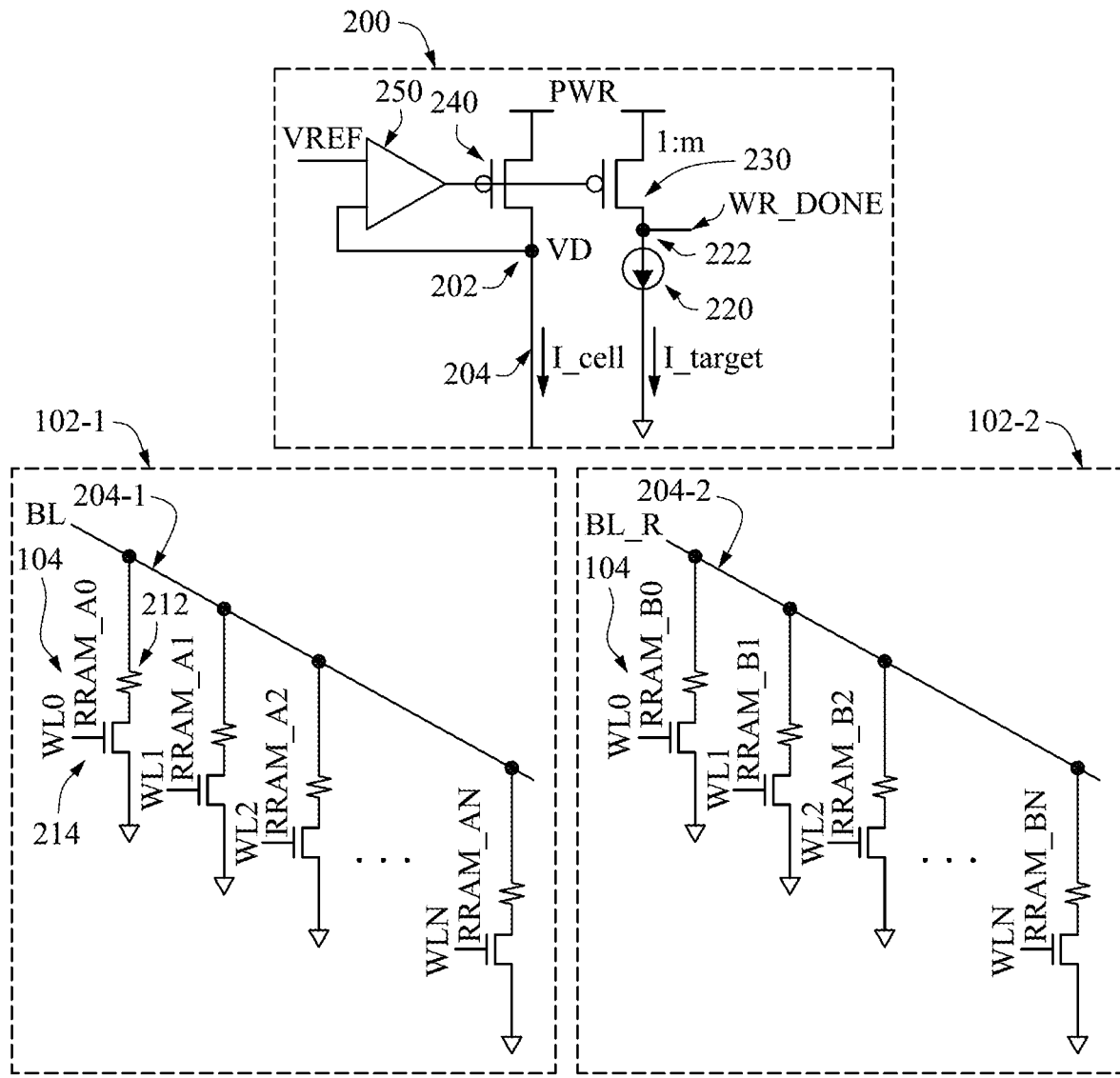
FIG. 2 is a schematic diagram of a write driver configured to perform write operations with reduced current and programming time in accordance with some embodiments.

FIG. 2 is a schematic diagram of a write driver 200 configured to perform write operations with reduced current and programming time in accordance with some embodiments. One or more write drivers 200 may be implemented in the write circuitry 140 of the memory device 100, and each write driver 200 may be configured for two-cells per one-bit write operations. Accordingly, the write driver 200 is coupled to the main array 102-1 and redundancy array 102-2 via one or more bit lines 204. In particular, in this example, the write driver 200 includes an output node 202 operably coupled to the main array 102-1 via a main bit line (BL) 204-1, and further operably coupled to the redundancy array 102-2 via a redundancy bit line (BL_R) 204-2. In other embodiments, each array 102 has a respective write driver 200.

Each memory cell 104 may comprise an RRAM memory cell that includes an RRAM resistive element 212 and an access transistor 214. The RRAM resistive element 212 has a resistive state that is switchable between a low resistive state and a high resistive state. The resistive states are indicative of a data value (e.g., a "1" or "0") stored within the RRAM resistive element 212. The RRAM resistive element 212 has a first terminal coupled to a bit line (BL or BL_R) and a second terminal coupled to the access transistor 214. The access transistor 214 has a gate coupled to a word line (WL), a drain coupled to the second terminal of the RRAM resistive element 212, and a source which may be coupled to a common source line (not shown) or ground.

Resistive switching in RRAM is carried out by set and reset operations. For example, to set a memory cell 104 from high resistance to low resistance, the appropriate word line (WL) is asserted to turn on the access transistor 214, and the write driver 200 applies a set pulse to the appropriate bit line (BL or BL_R) while the source line is ground. Similarly, a reset operation may be performed by asserting the selected word line (WL), grounding the selected bit line (BL or BL_R), and applying a result pulse to the source line, thus resetting the RRAM cell to the high resistance state.

As previously mentioned, RRAM memory cells may have resistance variability that can cause issues in reliably determining whether a particular memory cell has been set or reset. For example, some memory cells 104 may comprise a "fast bit" in which the RRAM resistive element 212 has a low threshold voltage and fast programming speed. On the other hand, other memory cells 104 may comprise a "slow bit" in which the RRAM resistive element 212 has a high threshold voltage and a slow programming speed. The variations in switching voltages and programming times may be attributed, for example, to non-uniformities in the fabrication process which degrades memory performance by reducing the margin between a set state and a reset state.

To address these issues, the write driver 200 is enhanced to operate with a two-cells per one-bit configuration while performing write operations with reduced current and programming time. In particular, the write driver 200 is configured to generate a signal WR_DONE indicating whether a write operation is a fast bit operation or a slow bit operation. If a fast bit is detected during a first write to the main array 102-1, the write driver 200 determines the first write to be reliable. In response, the write driver 200 automatically disables (e.g., skips, cancels, or otherwise avoids) a redundant write operation to the redundancy array 102-2. Thus, the write driver 200 advantageously saves power and improves programming time if the first programming operation is stable such that there is no retention concern.

The write driver 200 includes an indicator node 222 configured to provide the signal WR_DONE that indicates whether a write operation is a fast bit operation or a slow bit operation. A current source 220 (or current sink) is coupled between the indicator node 212 and ground. The current source 220 is configured to generate a target current I_target having a predetermined current level. The current source 220 pulls current through a first transistor 230 (e.g., a p-type MOSFET). The first transistor 230 (e.g., a reference transistor) includes a source (e.g., first source/drain (S/D) terminal) coupled to a power source (PWR), and a drain (e.g., second S/D terminal) coupled to the indicator node 222. Additionally, the gate of the first transistor 230 is coupled with a gate of a second transistor 240 (e.g., a p-type MOSFET) to form a current mirror circuit as further described below.

The write driver 200 also includes a comparator 250 (e.g., an amplifier) having an output coupled to the gates of the first transistor 230 and the second transistor 240. The comparator 250 and second transistor 240 are disposed between PWR and the output terminal 202. Moreover, the comparator 250 includes two input terminals—a first input (e.g., a non-inverting input terminal) coupled to the output node 202 and a second input (e.g., inverting input terminal) coupled to a reference voltage VREF. The second transistor 240 (e.g., drive transistor) includes a gate connected to an output of a comparator 250, a source coupled to PWR (e.g., first S/D terminal), and a drain (e.g., second S/D terminal) coupled to the output node 202. The comparator 250 and second transistor 240 thus form a closed loop that causes comparator 250 to modulate the gate of the second transistor 240, thereby generating a drive voltage VD at the output node 202 having a voltage equal to or based on the reference voltage VREF. The write driver 200 is thus configured to generate a cell current I_cell delivered to the bit line 204 of the selected RRAM memory cell for performing a write operation.

The current mirror circuit formed by the first transistor 230, second transistor 240, and comparator 250 is configured to duplicate the left side of the circuit (i.e., cell current I_cell through the second transistor 240) at the right side of the circuit (i.e., current through the first transistor 230). Therefore, during a write operation, if the cell current I_cell through the memory cell 104 equals or exceeds a current threshold defined by the target current I_target, the indicator node 222 outputs a high value or logical "1" for the signal WR_DONE. In other words, the write driver 200 determines the write operation to be a fast bit operation that is reliable for retention.

The current source 220 and target current I_target may be configured to generate a current level that enables the indicator node 222 to track the cell current I_cell with respect to a current threshold during a write operation of a memory cell 104. In one embodiment, the target current I_target is a predetermined current level that is based on a minimum amount of current to be delivered to a RRAM cell for performing a programming operation such as a set operation. Thus, the target current I_target may define a threshold current value for a RRAM cell to receive during a set operation such that the set stage is reliably performed without potential retention issues. Additionally, in some embodiments, the target current I_target is based on a current mirror ratio "1:m" of the write driver 200.

Suppose, for example, that it is determined that RRAM cells of a resistive memory device can be reliably set with 300 uA. Suppose further that the write driver 200 is configured with a "m" value of 0.5 to save current, meaning that a current of the right side of the current mirror (i.e., I_target) is half of the right side (i.e., I_cell). Accordingly, in this example, the write driver 200 may indicate whether a reliable set operation is performed with a cell current I_cell of 300 uA and a target current I_target of 150 uA, using a total of 450 uA. Additional details of the operation of the write driver 200 are described below.

Figure 3A:
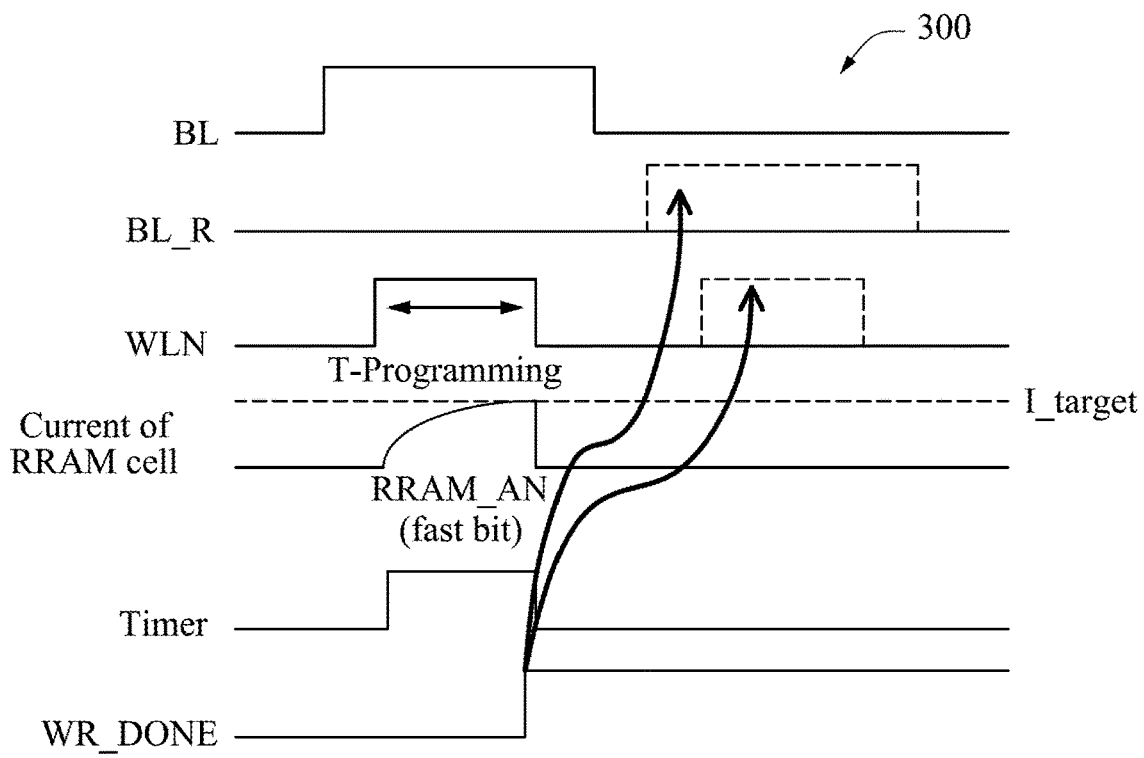
FIG. 3A is a timing diagram of a memory device configured to perform write operations with reduced current and programming time in accordance with some embodiments.

FIG. 3A is a timing diagram 300 of a memory device configured to perform write operations with reduced current and programming time in accordance with some embodiments. The timing diagram 300 illustrates an example in which the write driver 200 detects that a write operation on the main array 102-1 is a fast bit operation (i.e., is reliably performed). In other words, while programming a set operation on the main array 102-1, the main bit line (BL) 204-1, WLN, and timer are driven to a high state. Additionally, during this operation, the current of the RRAM cell (i.e., cell current I_cell) meets or exceeds the threshold defined by the target current I_target, driving the signal WR_DONE high as previously described.

In response to indication by the signal WR_DONE that a first set operation for a first memory cell of the main array 102-1 is associated with a fast bit and is reliably performed, the write driver 200 is configured to bypass performing a second set operation for a second memory cell of the redundancy array 102-2. In other words, the write driver 200 avoids asserting the redundancy bit line (BL_R) 204-2 and WLN for a second set operation as indicated by the dashed lines. Advantageously, programming time and current that would have otherwise been performed for the second set operation is eliminated. Thus, by using a current mirror to detect whether a set operation current exceeds a threshold, the write driver 200 is configured to implement a two-cells per one-bit scheme with better performance and reduced power.

Figure 3B:
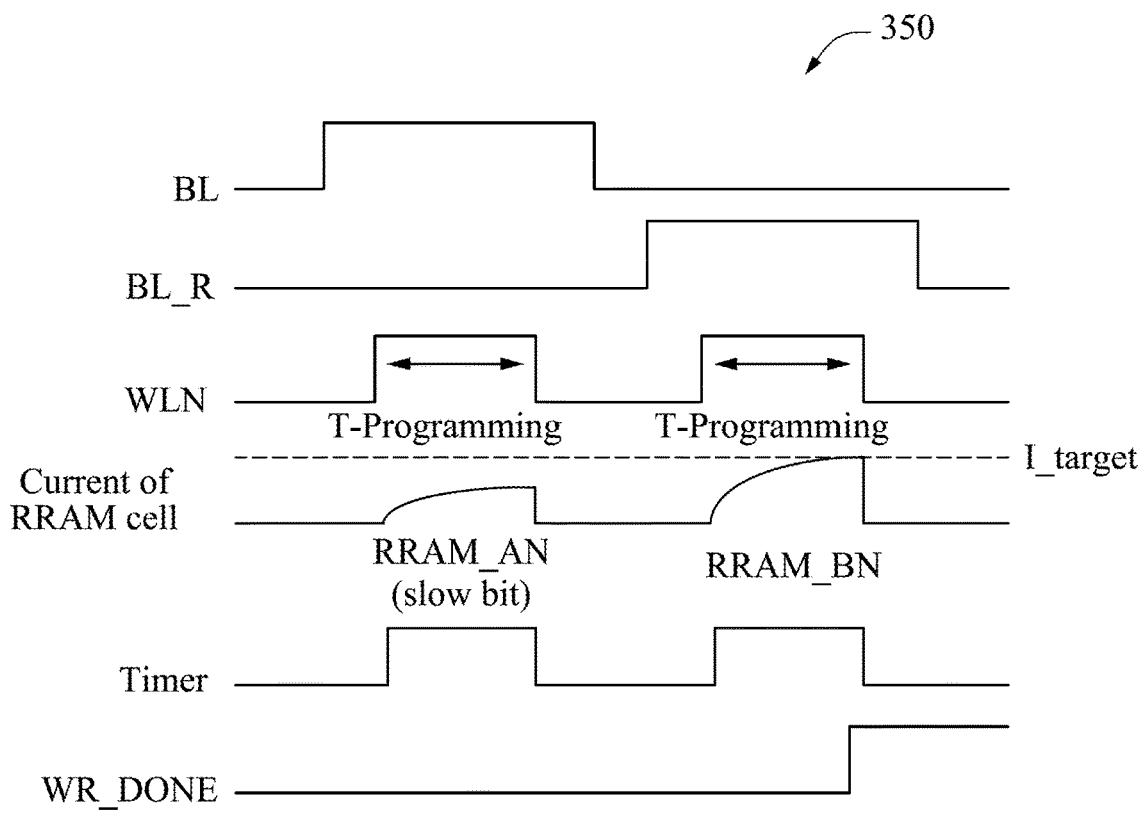
FIG. 3B is another timing diagram of a memory device configured to perform write operations with reduced current and programming time in accordance with some embodiments.

FIG. 3B is another timing diagram 350 of a memory device configured to perform write operations with reduced current and programming time in accordance with some embodiments. The timing diagram 350 illustrates an example in which the write driver 200 detects that a write operation on the main array 102-1 is a slow bit operation (i.e., considered potentially unreliable). That is, during a set operation on the main array 102-1, the current of the RRAM cell (i.e., cell current I_cell) does not meet or exceed the threshold defined by the target current I_target. The signal WR_DONE therefore remains in a low state.

In response to indication by the signal WR_DONE that a first set operation for a first memory cell 104 of the main array 102-1 is associated with a slow bit and is unreliable, the write driver 200 is configured to trigger a second set operation for a second memory cell 104 of the redundancy array 102-2. The write driver 200 thus ensures redundancy for the bit. Although the second set operation is not avoided in this instance, the total current for performing two set operations is nonetheless reduced due to the lower current associated with the slow bit.

Figures 4A, 4B:
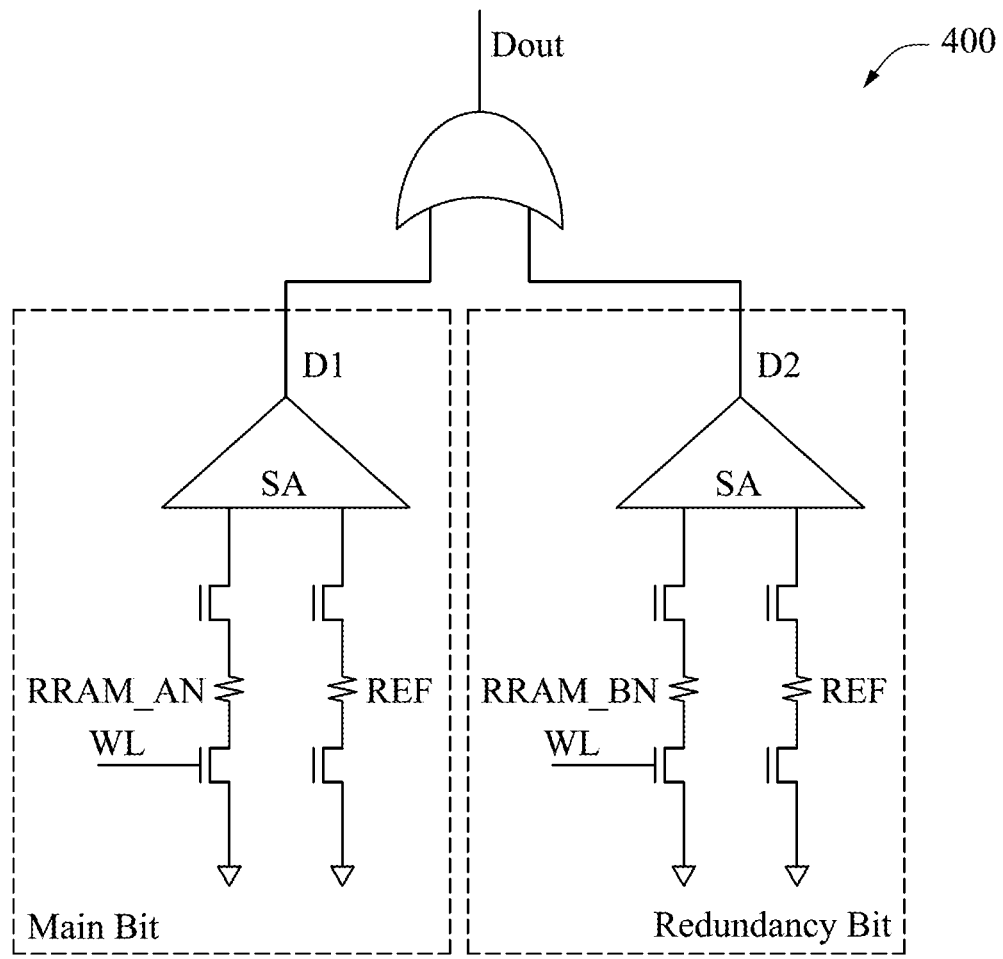
FIG. 4A is a logic circuit of a memory device configured to detect whether a set operation has been performed in accordance with some embodiments.
FIG. 4B is a truth table of the logic circuit.

FIG. 4A is a logic circuit 400 of a memory device configured to detect whether a set operation has been performed in accordance with some embodiments. FIG. 4B is a truth table 450 of the logic circuit 400. As shown by FIGS. 4A-4B, the logic circuit 400 outputs a data output Dout to a high state if either of a corresponding main bit and redundancy bit have been set. Accordingly, a memory device may detect a bit as being in a set state even if only one RRAM cell indicates the set state in a two-cell per one-bit configuration. For example, if a fast bit is detected on the main array 102-1, it implies it is easy to have a stable stage on this memory cell 104 and there is no retention concern. Thus, the set need not be performed again on the redundancy array 102-2 to save power, and the redundancy cell can remain at the reset stage.

Figure 5:
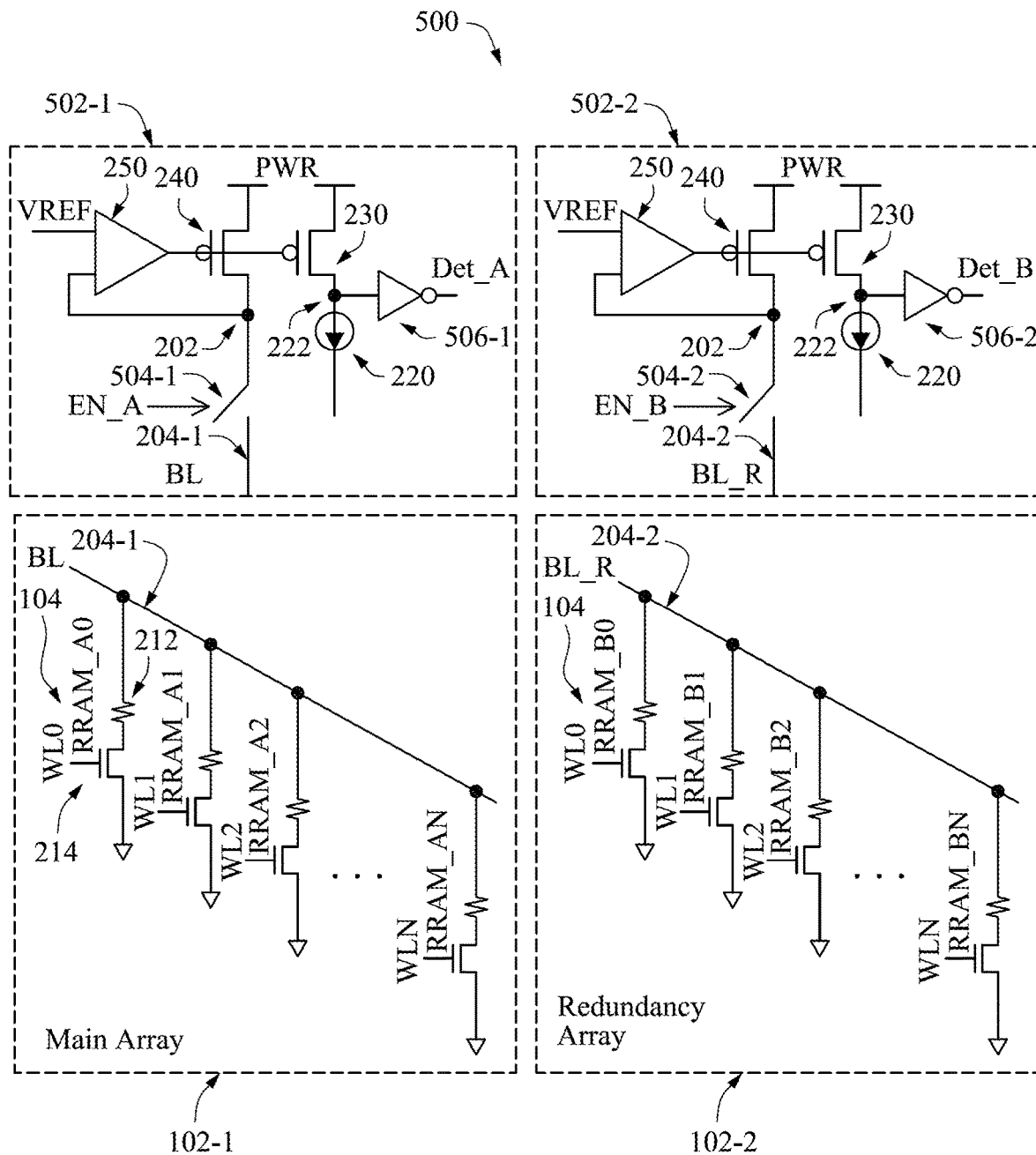
FIG. 5 is a schematic diagram of write driver circuitry configured to perform write operations with reduced current and programming time in accordance with some embodiments.

FIG. 5 is a schematic diagram of write driver circuitry 500 configured to perform write operations with reduced current and programming time in accordance with some embodiments. In particular, write driver circuitry 500 includes a main write driver 502-1 operably coupled to the main array 102-1 via a main bit line (BL) 204-1, and a redundancy write driver 502-2 operably coupled to the redundancy array 102-2 via a redundancy bit line (BL_R) 204-2. Accordingly, pairs of write drivers 502 may be implemented in the write circuitry 140 of the memory device 100, and each pair of write drivers 502 may be configured for two-cells per one-bit write operations that may be performed simultaneously or in parallel. The write drivers 502 operate in a similar manner with similar components to that previously described herein and thus the description is not repeated for brevity.

In this embodiment, each write driver 502 includes a power switch 504 coupled to the output node 202, and an inverter 506 coupled to the indicator node 222. That is, the main write driver 502-1 includes a main power switch 504-1 configured to selectively couple the output node 202 with the main bit line (BL) 204-1 via a main enable signal (EN_A). Similarly, the redundancy write driver 502-2 includes a redundancy power switch 504-1 configured to selectively couple the output node 202 with the redundancy bit line (BL) 204-2 via a redundancy enable signal (EN_B). Furthermore, the main write driver 502-1 includes a main inverter 506-1 configured to output a main indicator signal (Det_A). The redundancy write driver 502-2 includes a redundancy inverter 506-2 configured to output a redundancy indicator signal (Det_B). Additional details of operation of write driver circuitry 500 are described below.

Figures 6A, 6B:
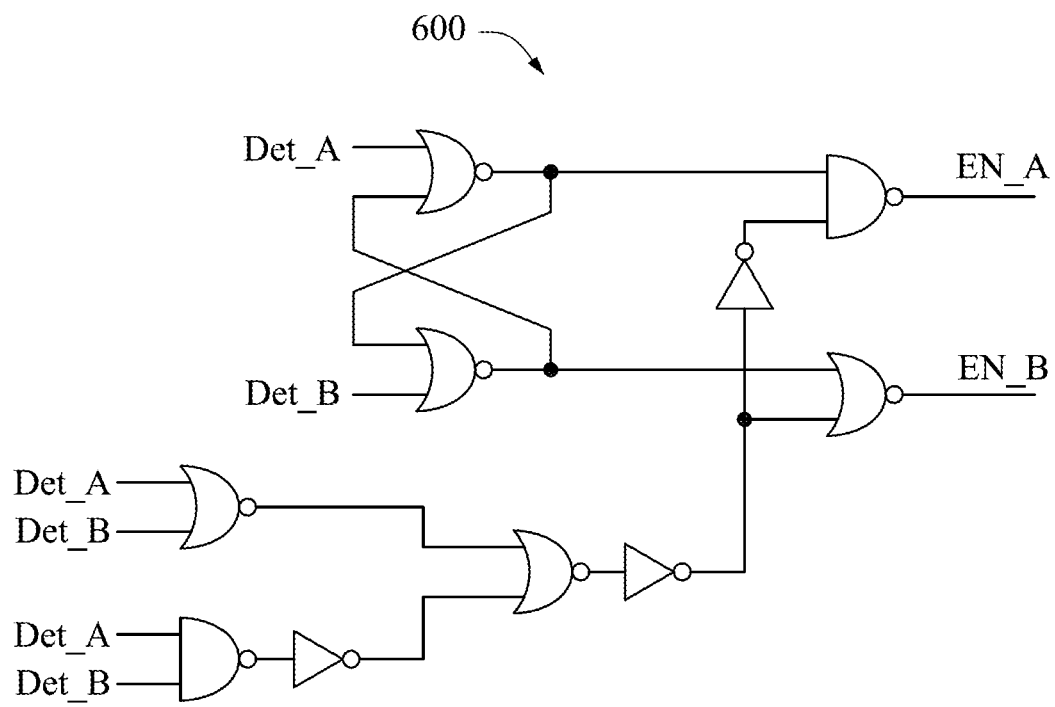
FIG. 6A is a logic controller configured to control write driver circuitry in accordance with some embodiments.
FIG. 6B is a truth table of the logic controller.

FIG. 6A is a logic controller 600 configured to control write driver circuitry 500 in accordance with some embodiments. In some examples, the logic controller 600 is part of the write circuitry 140 and/or control circuitry 150 of FIG. 1. FIG. 6B is a truth table 650 of the logic controller 600. Referring to FIGS. 6A-6B in conjunction with FIG. 5, consider that if the main enable signal (EN_A) is high, the main bit line (BL) 204-1 is driven by a voltage based on VREF and the main array 102-1 is activated for programming a set operation by the main write driver 502-1. Conversely, if the main enable signal (EN_A) is low, the main bit line (BL) 204-1 is disconnected and the main array 102-1 is disabled for programming a set operation by the main write driver 502-1. The redundancy write driver 502-1 and redundancy array 102-2 are similarly activated or disabled based on the redundancy enable signal (EN_B) selectively coupling the redundancy bit line (BL_R) 204-2.

Using the logic controller 600 to control write driver circuitry 500, the redundancy array 102-2 is disabled (EN_B is logical "0") if the main write driver 502-1 indicates a detected fast bit before the redundancy write driver 502-2 (i.e., Det_A is logical "1" and Det_B is logical "0"). Conversely, the main array 102-1 is disabled (EN_A is logical "0") if the redundancy write driver 502-2 indicates a detected fast bit before the main write driver 502-1 (i.e., Det_B is logical "1" and Det_A is logical "0"). If the main write driver 502-1 and redundancy write driver 502-2 output the same stage (i.e., Det_A and Det_B are both logical "0" or both logical "1"), the logic controller 600 is configured to activate one memory array and to disable the other array (e.g., activate main array 102-1 and disable redundancy array 102-2 by outputting EN_A at logical "1" and EN_B at logical "0"). Additional details of operation of write driver circuitry 500 and logic controller 600 are described below.

Figure 7:
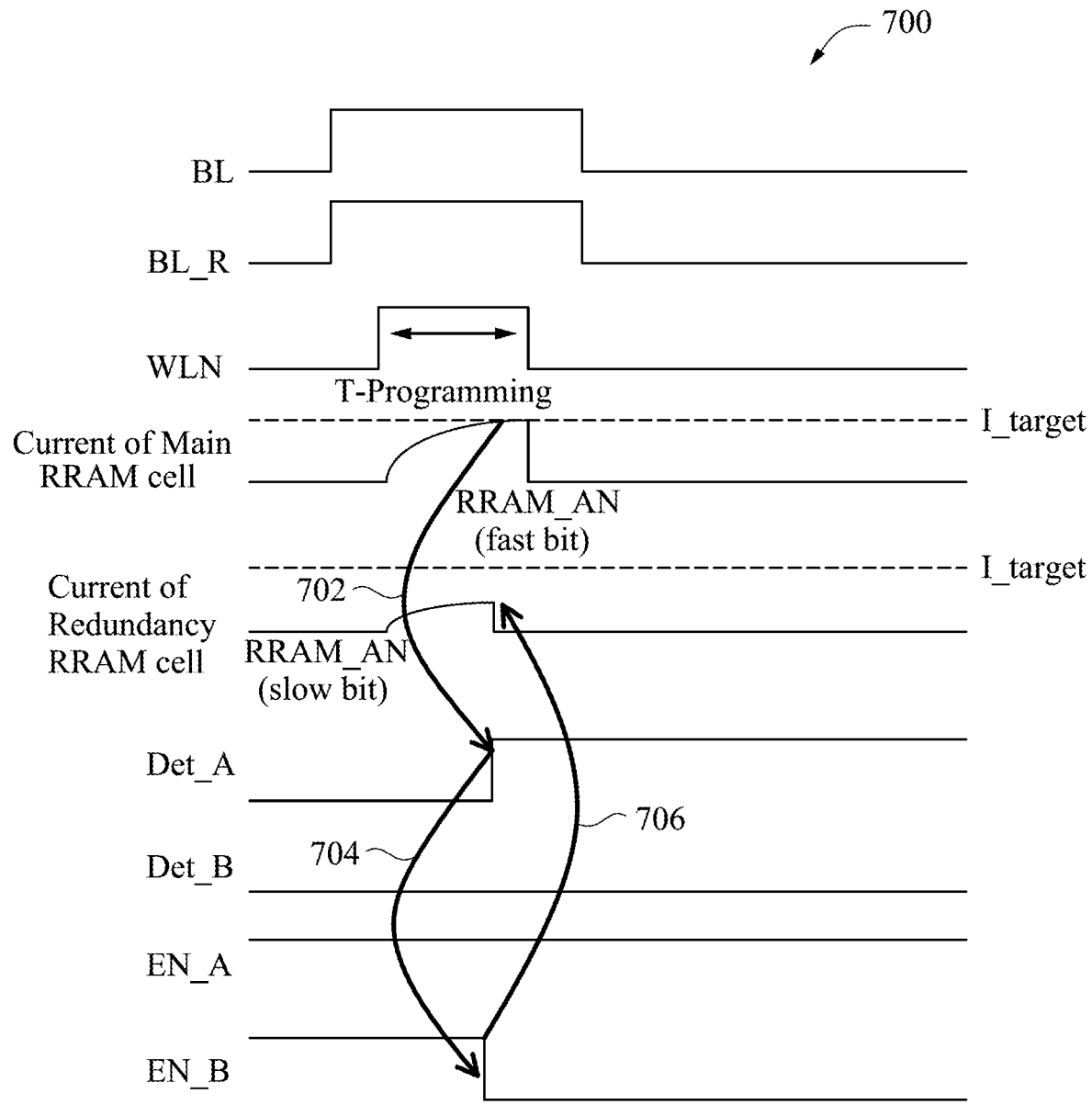
FIG. 7 is a timing diagram of a memory device configured with the logic controller to control write driver circuitry in accordance with some embodiments.

FIG. 7 is a timing diagram 700 of a memory device configured with the logic controller 600 to control write driver circuitry 500 in accordance with some embodiments. In particular, the timing diagram 700 illustrates a case in which, during simultaneous set operations at the main array 102-1 and redundancy array 102-2, the main write driver 502-1 detects a fast bit before the redundancy write driver 502-2 (i.e., Det_A is logical "1" and Det_B is logical "0"). In other words, in this example, the current of the main RRAM cell exceeds the target current I_target due to a fast bit, and the current of the redundancy RRAM cell does not exceed the target current I_target due to a slow bit.

The target current I_target being exceeded causes the main write driver 502-1 to drive Det_A to logical "1" as indicated by arrow 702. In turn, this drives EN_B to logical "0" to disable the redundancy array 102-2 as indicated by arrow 704. Accordingly, the current of the redundancy RRAM cell is cutoff before the programming cycle ends (e.g., prior to WLN pulled low) as indicated by arrow 706, thus reducing current. Furthermore, the total current for performing two set operations is reduced by the current of the redundancy RRAM cell being relatively low due to the slow bit. Still further, since the configuration of write driver circuitry 500 enables the two set operations to be performed in parallel, programming time is half that of traditional two-cells per one-bit implementations.

Figure 8:
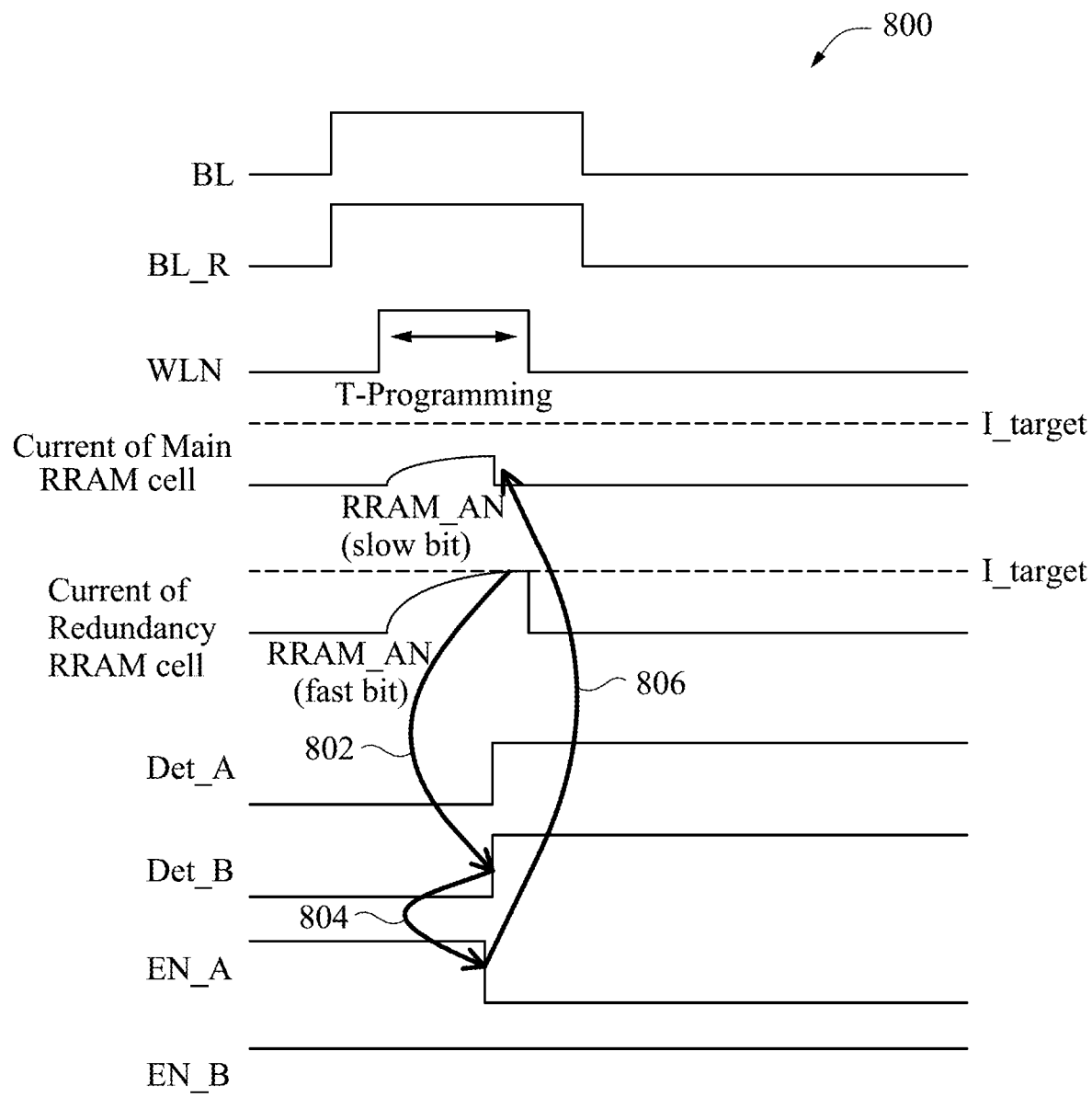
FIG. 8 is another timing diagram of a memory device configured with the logic controller to control write driver circuitry in accordance with some embodiments.

FIG. 8 is another timing diagram 800 of a memory device configured with the logic controller 600 to control write driver circuitry 500 in accordance with some embodiments. In particular, the timing diagram 800 illustrates a case in which, during simultaneous set operations at the main array 102-1 and redundancy array 102-2, the redundancy write driver 502-2 detects a fast bit before the main write driver 502-1 (i.e., Det_A is logical "0" and Det_B is logical "1"). In other words, in this example, the current of the redundancy RRAM cell exceeds the target current I_target due to a fast bit, and the current of the main RRAM cell does not exceed the target current I_target due to a slow bit.

The target current I_target being exceeded causes the redundancy write driver 502-2 to drive Det_B to logical "1" as indicated by arrow 802. In turn, this drives EN_A to logical "0" to disable the redundancy array 102-2 as indicated by arrow 804. Accordingly, the current of the main RRAM cell is cutoff before the programming cycle ends (e.g., prior to WLN pulled low) as indicated by arrow 806, thus reducing current. Additional advantages previously described above also apply.

Figure 9:
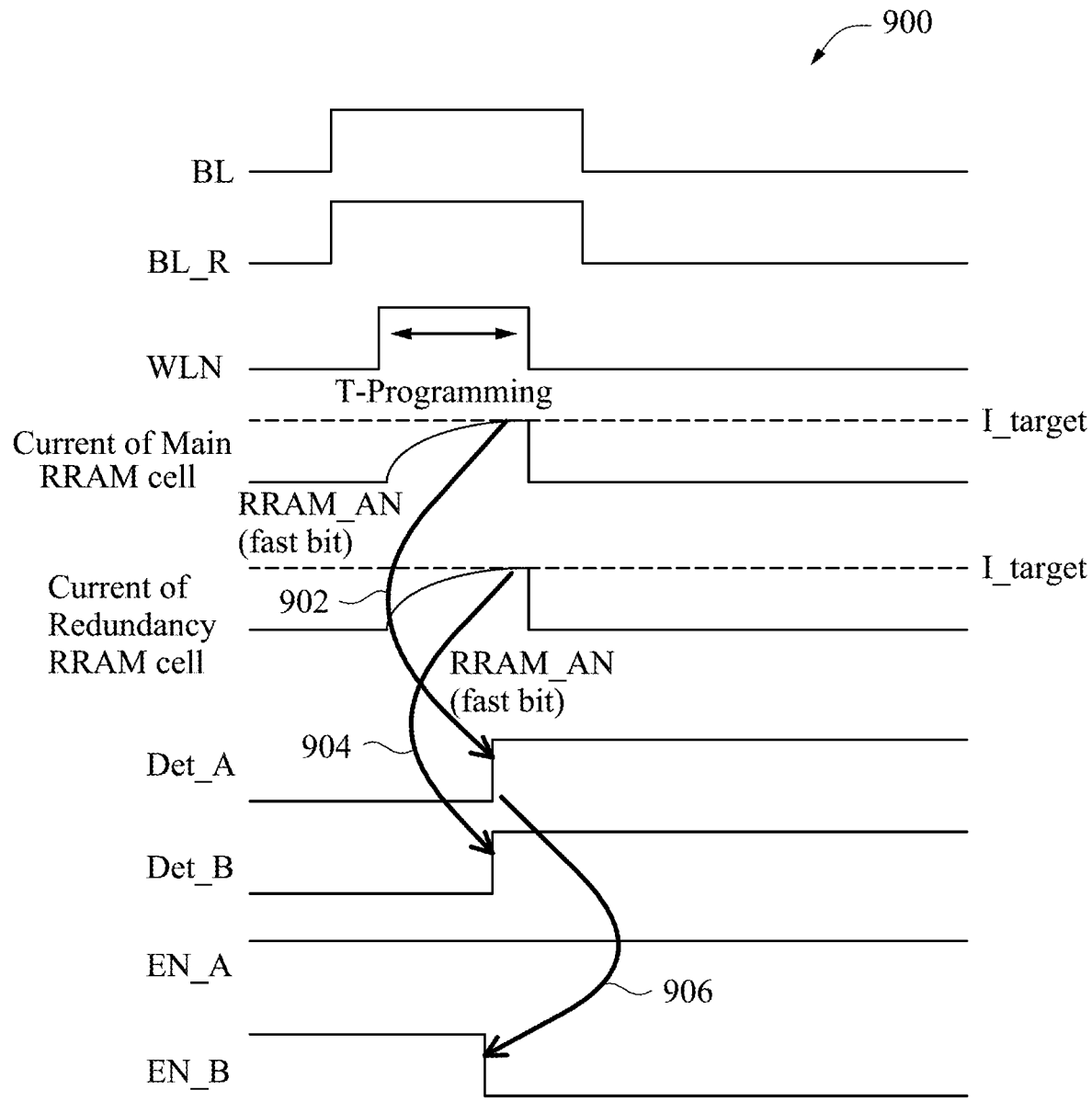
FIG. 9 is yet another timing diagram of a memory device configured with the logic controller to control write driver circuitry in accordance with some embodiments.

FIG. 9 is yet another timing diagram 900 of a memory device configured with the logic controller 600 to control write driver circuitry 500 in accordance with some embodiments. In particular, the timing diagram 900 illustrates a case in which, during simultaneous set operations at the main array 102-1 and redundancy array 102-2, both the main write driver 502-1 and the redundancy write driver 502-2 detect fast bits (i.e., Det_A is logical "1" and Det_B is logical "1"). The target current I_target being exceeded causes the main write driver 502-1 to drive Det_A to logical "1" as indicated by arrow 902. Additionally, the target current I_target being exceeded causes the redundancy write driver 502-2 to drive Det_B to logical "1" as indicated by arrow 904. With both Det_A and Det_B driven to a high state, the logic controller 600 is configured to activate one memory array and to disable the other array (e.g., activate main array 102-1 and disable redundancy array 102-2 by outputting EN_A at logical "1" and EN_B at logical "0") as indicated by arrow 906.

Figure 10:
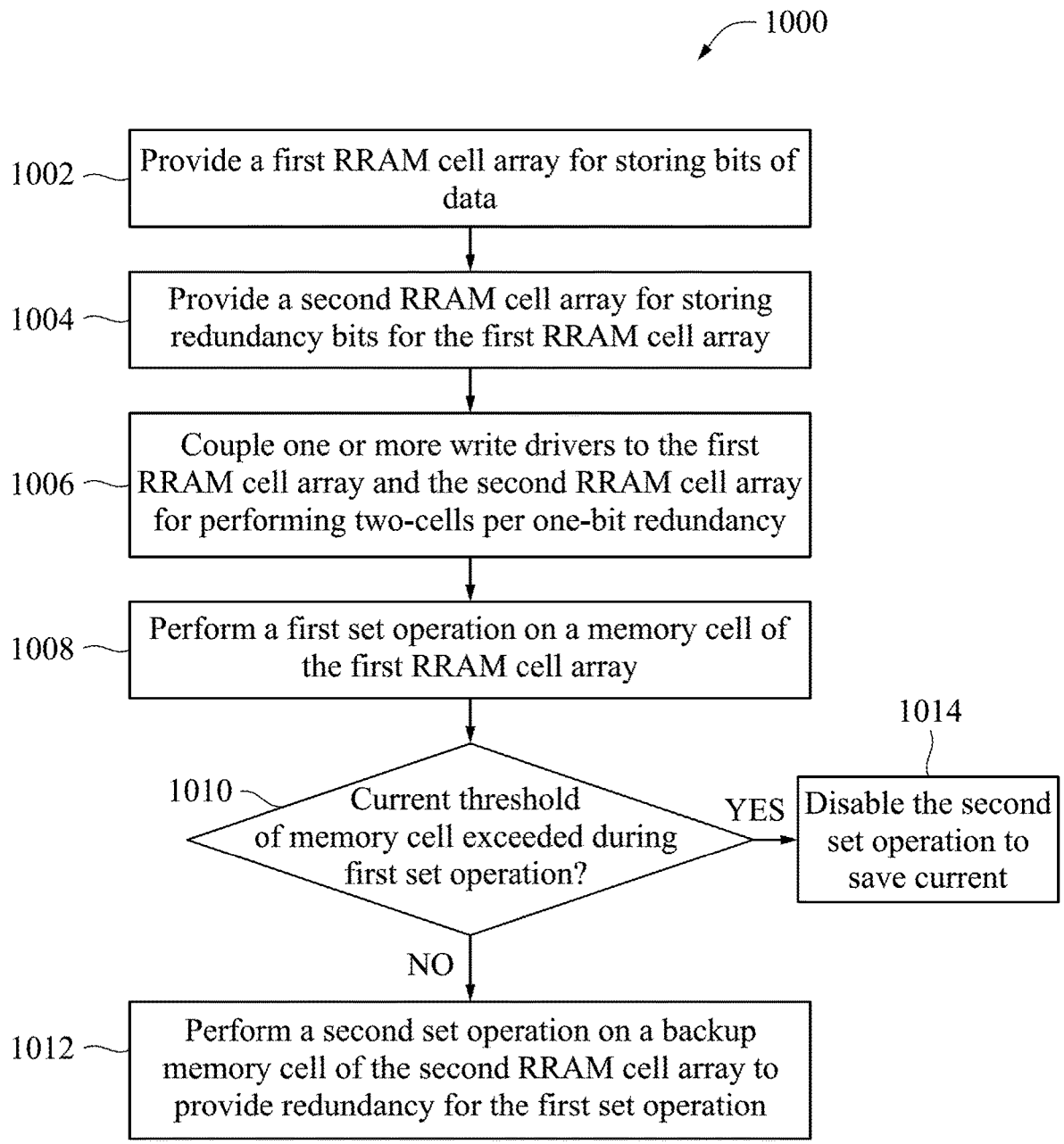
FIG. 10 illustrates an example method for a two-cell per one-bit write operation.

FIG. 10 illustrates an example method 1000 for a two-cell per one-bit write operation. At operation 1002, a first RRAM cell array for storing bits is provided. At operation 1004, a second RRAM cell array for storing redundancy bits for the first RRAM cell array is provided. At operation 1006, one or more write drivers are coupled to the first RRAM cell array and the second RRAM cell array for performing two-cells per one-bit redundancy. At operation 1008, a first set operation is performed on a memory cell of one of the first RRAM cell array and the second RRAM cell array.

At operation 1010, it is determined whether a current threshold of the memory cell is exceeded during the first set operation. If not, the method 1000 proceeds to operation 1012 and a second set operation is performed on a backup memory cell of the second RRAM cell array to provide redundancy for the first set operation. Otherwise, the method 1000 proceeds to operation 1014 and the second set operation is disabled to save current. In other words, in response to determining the current threshold of the memory cell is exceeded during the first set operation, the second set operation is disabled at another of the first RRAM cell array and the second RRAM cell array (i.e., different than the array written in operation 1008) to save current.

Accordingly, the various embodiments disclosed herein provide a memory device, comprising: a main array comprising main memory cells; a redundancy array comprising redundancy memory cells; and write circuitry configured to perform a first programming operation on a main memory cell, to detect whether a current of the main memory cell exceeds a predefined current threshold during the first programming operation, and to disable a second programming operation for a redundancy memory cell if the current of the main memory cell exceeds the predefined current threshold during the first programming operation.

In accordance with further disclosed embodiments, a write circuitry for a memory device, comprising: a comparator having a first input terminal configured to receive a reference voltage signal, a second input terminal, and an output terminal; a reference transistor having a gate terminal connected to the output terminal of the comparator, a first S/D terminal connected to a power terminal, and a second S/D terminal connected to an indicator node, the indicator node connected to a current source and configured to generate a reference current; and a drive transistor having a gate terminal connected to the output terminal of the comparator, a first S/D terminal connected to the power terminal, and a second S/D terminal connected to the second input terminal of the comparator and configured to output a programming signal to a memory cell; wherein the indicator node is configured to output an indicator signal based on a comparison of a current of the memory cell and the reference current.

In accordance with other disclosed embodiments, write circuitry for a RRAM memory device, comprising: one or more write drivers configured to perform two-cells per one-bit write operations to a main array and a redundancy array, each write driver configured to output an indicator signal that indicates whether a first operation is detected to be reliably performed on a RRAM memory cell; and a logic controller configured to control the one or more write drivers to disable a second programming operation if the indicator signal indicates that the first programming operation is detected to be reliably performed.

In accordance with other disclosed embodiments, a write method includes providing a first RRAM cell array for storing bits; providing a second RRAM cell array for storing redundancy bits for the first RRAM cell array; coupling one or more write drivers to the first RRAM cell array and the second RRAM cell array for performing two-cells per one-bit redundancy; performing a first set operation on a memory cell of one of the first RRAM cell array and the second RRAM cell array; determining whether a current threshold of the memory cell is exceeded during the first set operation; and in response to determining the current threshold of the memory cell is exceeded during the first set operation, disabling a second set operation at another of the first RRAM cell array and the second RRAM cell array.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a main array comprising main memory cells;
   a redundancy array comprising redundancy memory cells; and
   write circuitry configured to perform a first programming operation on a main memory cell, to detect whether a current of the main memory cell exceeds a predefined current threshold during the first programming operation, and to disable a second programming operation for a redundancy memory cell if the current of the main memory cell exceeds the predefined current threshold during the first programming operation.

2. The memory device of claim 1, wherein the write circuitry is configured to perform the second programming operation on the redundancy cell if the current of the main memory cell does not exceed the predefined current threshold during the first programming operation.

3. The memory device of claim 1, wherein the write circuitry is configured to detect whether the current of the main memory cell exceeds the predefined current threshold based on a current mirror circuit.

4. The memory device of claim 3, wherein the current mirror circuit includes a first transistor, a second transistor, and a comparator with an output operably coupled to respective gates of the first transistor and the second transistor.

5. The memory device of claim 4, wherein:
   the first transistor includes a drain coupled with an indicator node;
   a current source is coupled with the indicator node and configured to generate a current level that defines the predefined current threshold; and
   the first transistor is configured to output a signal at the indicator node that indicates whether the current of the main memory cell exceeds the predefined current threshold.

6. The memory device of claim 5, wherein the write circuitry is configured, in response to the signal at the indicator node indicating that the current of the main memory cell exceeded the predefined current threshold, to avoid triggering the second programming operation after completing the first programming operation.

7. The memory device of claim 5, wherein the write circuitry is configured, in response to the signal at the indicator node indicating that the current of the main memory cell exceeded the predefined current threshold, to disable the second set being performed concurrently with the first programming operation.

8. The memory device of claim 1, wherein:
the main memory cells and the redundancy memory cells comprise RRAM memory cells; and
the write circuitry is configured to perform the first programming operation and the second programming operation as part of a two-cells per one-bit write operation, and to disable the second programming operation if the first programming operation is reliably performed to reduce write current and write time for the two-cells per one-bit write operation.

9. The memory device of claim 1, wherein the write circuitry includes one or more write drivers coupled to the main array and the redundancy array via one or more bit lines.

10. Write circuitry for a memory device, comprising:
a comparator having a first input terminal configured to receive a reference voltage signal, a second input terminal, and an output terminal;
a reference transistor having a gate terminal connected to the output terminal of the comparator, a first S/D terminal connected to a power terminal, and a second S/D terminal connected to an indicator node, the indicator node connected to a current source and configured to generate a reference current; and
a drive transistor having a gate terminal connected to the output terminal of the comparator, a first S/D terminal connected to the power terminal, and a second S/D terminal connected to the second input terminal of the comparator and configured to output a programming signal to a bit line of a memory cell of a first memory array;
wherein the indicator node is configured to output an indicator signal based on a comparison of a current of the memory cell and the reference current.

11. The write circuitry of claim 10, wherein:
the indicator signal indicates whether the current of the memory cell from the programming signal exceeds the reference current.

12. The write circuitry of claim 11, wherein:
the write circuitry is configured to disable a backup programming signal if the indicator signal indicates the current of the memory cell from the programming signal exceeds the reference current.

13. The write circuitry of claim 12, wherein:
the write circuitry is configured to perform the backup programming signal if the indicator signal indicates the current of the memory cell from the programming signal does not exceed the reference current.

14. The write circuitry of claim 13, wherein:
the programming signal and the backup programming signal are corresponding write operations of a two-cells per one-bit write operation;
the programming signal is performed on the first memory array; and
the backup programming signal is performed on a second memory array.

15. The write circuitry of claim 10, wherein:
the reference transistor and the drive transistor form a current mirror circuit.

16. A memory write method, comprising:
providing a first RRAM cell array for storing bits;
providing a second RRAM cell array for storing redundancy bits for the first RRAM cell array;
coupling one or more write drivers to the first RRAM cell array and the second RRAM cell array for performing two-cells per one-bit redundancy;
performing a first set operation on a memory cell of one of the first RRAM cell array and the second RRAM cell array;
determining whether a current threshold of the memory cell is exceeded during the first set operation; and
in response to determining the current threshold of the memory cell is exceeded during the first set operation, disabling a second set operation at another of the first RRAM cell array and the second RRAM cell array.

17. The method of claim 16, further comprising:
in response to determining the current threshold of the memory cell is not exceeded during the first set operation, performing the second set operation on a backup memory cell of the second RRAM cell array to provide redundancy for the first set operation.

18. The method of claim 16, further comprising:
determining whether the current threshold of the memory cell is exceeded during the first set operation based on a current mirror circuit.

19. The method of claim 16, wherein the disabling of the second set operation includes bypassing the second set operation after the first set operation is completed.

20. The method of claim 16, wherein the disabling of the second set operation includes disconnecting a write driver performing the second set operation during simultaneous programming with the first set operation.

* * * * *